United States Patent [19]
Obeng

[11] Patent Number: 6,162,733
[45] Date of Patent: Dec. 19, 2000

[54] METHOD FOR REMOVING CONTAMINANTS FROM INTEGRATED CIRCUITS

[75] Inventor: Yaw Samuel Obeng, Orlando, Fla.

[73] Assignee: Lucent Technologies Inc., Murray Hill, N.J.

[21] Appl. No.: 09/232,120

[22] Filed: Jan. 15, 1999

[51] Int. Cl.⁷ .................... H01L 21/302; H01L 21/461
[52] U.S. Cl. .................. 438/706; 438/714; 438/795; 134/1.3; 134/1.2; 216/67; 216/69
[58] Field of Search ..................... 438/471, 475, 438/477, 706, 906, 795, 974, 714; 134/1.3, 1.2, 21, 1.1; 156/343; 216/67, 69

[56] References Cited

U.S. PATENT DOCUMENTS

| 5,380,401 | 1/1995 | Jones et al. | 156/665 |
| 5,858,878 | 1/1999 | Toda | 438/725 |

*Primary Examiner*—Charles Bowers
*Assistant Examiner*—Hsien-Ming Lee
*Attorney, Agent, or Firm*—Schnader Harrison Segal & Lewis LLP

[57] ABSTRACT

A method for removing contaminants from integrated circuit devices. Particularly disclosed is a method for removing alkali metal and halogen-based contaminants from an integrated circuit device as the device is being fabricated.

13 Claims, No Drawings

METHOD FOR REMOVING CONTAMINANTS FROM INTEGRATED CIRCUITS

BACKGROUND OF THE INVENTION

1. Field of the Invention

The present invention relates to a method for removing contaminants from integrated circuit devices. The invention relates more particularly to a method for removing alkali metal (e.g., sodium, potassium, etc.) and halogen-based (e.g., fluorine) contaminants from the surfaces of an integrated circuit as the device is being fabricated.

2. Background of the Invention

Semiconductor integrated circuit devices typically comprise multiple layers of vertically stacked metal interconnect layers with dielectric materials disposed between them. The fabrication of such devices typically involves the repeated deposition or growth, patterning, and etching of thin films of semiconductor, metal, and dielectric materials. Between these process steps the device is typically subjected to various cleaning steps which involve cleaning surface contaminants and residues, removal of damaged surface layers, and chemical conditioning of the material surface to optimize subsequent processing. Such etching and cleaning steps result in undesirable materials being present on the surface of the device as it is being fabricated.

For example, it is known to form a patterned resist layer, such as an oxide hard mask or polymeric resist, on a metal-containing layer (which is usually formed by a deposition process) using conventional photoresist and photolithographic techniques. After the oxide hard mask or polymeric resist is formed, conventional reactive ion etching processes using halogen-containing etchants, such as $Cl_2$, $BCl_3$, $CCl_4$, $SiCl_4$, $CF_4$, $NF_3$, $SF_6$, and mixtures thereof, are used to etch the metal-containing layers to form a patterned metal-containing layer. Such reactive etching processes leave corrosive etchant byproducts, remnant resist, and sidewall deposits on the sidewalls of the etched features.

Moreover, it is typical to then cover the patterned metal-containing layer with a suitable dielectric material, such as silicon oxide, silicon nitride, or any other film that has dielectric properties. The dielectric layer is then, typically, masked and etched to open narrow profile openings in the dielectric layer. Such openings are known as vias and serve to provide a point of contact between the underlying metal-containing layer and a metal-containing layer subsequently applied over the dielectric material. Vias are typically formed by a plasma etching process which is well known to those of skill in the art. It is typical for the vias to be defined by placing a photoresist pattern over the dielectric layer and then etching the exposed dielectric layer to form the vias. For example, the dielectric film may be etched in a plasma processing reactor utilizing a fluorine based gas such as $CHF_3$, $CF_4$, $C_2F_6$, sometimes in combination with $O_2$, Ar or He. A typical process for etching a dielectric layer to form a via is described in U.S. Pat. No. 5,176,790, which issued in the names of Arleo et al., the subject matter of which is herein incorporated by reference.

Unfortunately, since etching of the metal-containing layer is normally accomplished utilizing a halogen-based gas (e.g., chlorine) the etching process results in contamination of the device with, among other things, a halogen such as chlorine. When the chlorine contaminant is exposed to moisture, corrosion of the device results. Moreover, etching of the dielectric layer is typically conducted within a chamber, by utilizing a halogen-based (e.g., fluorine) plasma. To withstand the harsh conditions generated by the halogen-based (e.g., fluorine) plasma, the components within the chamber are normally fabricated from ceramic materials, with alumina being a preferred ceramic material for such chamber components. However, the ceramic components, when subjected to the plasma conditions, tend to contaminate the device with alkali metal (e.g., potassium, sodium, etc.).

Such halogen and alkali contaminants must be removed to obtain optimum performance, since the contaminants may lead to device defects, lower oxide breakdown fields, and corrosion problems as well.

It is known to follow the etching steps with a post-etch rinse, which, typically, comprises using an organic solvent. Such post-etch rinses are utilized to remove organic residues, inorganic residues, or mixed organic-inorganic residues. The composition of the post-etch rinse organic solvent will depend, of course, on the residue being removed.

A problem associated with the exposure of the metal films, dielectric materials and polymeric resist materials to organic solvents is that the solvents frequently have the detrimental consequences of metal corrosion, redeposition of contaminants and metallic contamination. A particular problem is that the surfaces may adsorb metallic ions, such as from alkali metals in the organic solvents. Particularly, metallic and dielectric films are vulnerable to contamination by alkali metals contained in the organic solvents.

Thus, it has been proposed to remove such contaminants by utilizing a down stream halogen-based (e.g., fluorine) plasma etch to etch a thin layer of the contaminated device surface (i.e., the dielectric surface, metal-containing layer surface, via wall surface, etc.). The device is then subsequently rinsed in water. This method recognizes that alkali metals tend to bind tenaciously to oxides and that the alkali metals will be within a few Angstrom of the surface of the device surface. Thus, by etching a thin layer of the contaminated surface, the contaminating alkali metals will be etched, rendered water soluble and washed away. However, during such down stream halogen-based (e.g., fluorine) plasma etching the device is subjected to a large amount of reactive halogen-species, e.g., fluorine-species. Such halogen-species may react with the oxide surface and may also become trapped in the pores and cavities of the surface being etched as labile halogen (e.g., labile fluorine). Moreover, subsequent water and/or solvent rinse results in corroded vias or metal connections due to the solvated, labile halogen acting as an electrolyte. Therefore, although the alkali metal contaminants may be sufficiently removed, the process introduces additional contaminants to the device.

SUMMARY OF THE INVENTION

It is an object of the present invention to provide a method for producing semiconductor integrated circuit devices which are substantially free from alkali metal and halogen (e.g., fluorine) contaminants. Another object is to provide improved semiconductor devices. The method includes the steps of: (1) treating the device with a down stream halogen-based plasma etch in a suitable process chamber to remove alkali metal contaminants from the device; (2) introducing an inert gas into the chamber and passing the inert gas over the device; (3) introducing a gas comprising at least one gas selected from $N_2$, Ar, $O_2$, or a $H_2$ and $N_2$ gas mixture into the chamber; (4) turning on an excitation source and forming a plasma; (5) turning off the excitation source; and (6) introducing an inert gas, for example $N_2$, into the chamber and removing the device from the chamber.

DETAILED DESCRIPTION

The invention will be understood more fully from the detailed description given below, which however, should not be taken to limit the invention to a specific embodiment, but is for explanation and understanding only.

As stated above, the prior art has proposed to remove alkali metal contaminants from semiconductor integrated circuit devices by utilizing a down stream halogen plasma etch process. Typically, such a process includes the steps of: placing a device wafer into a suitable process chamber; evacuating the chamber to a sub-atmospheric pressure; charging the chamber with a halogen gas, for example, fluorine gas such as an $NF_3/N_2$ mixture and raising the pressure in the chamber to, for example, about 0.5 to 5 Torr; turning on an excitation source (e.g., microwave at a frequency of about 2.45 GHz, RF, etc.) to form a plasma for a predetermined amount of time (e.g., 5 to 60 seconds) and at a predetermined temperature (e.g., 25° to 120° C.); turning off the excitation source and evacuating the chamber to a sub-atmospheric pressure; charging the chamber with nitrogen gas to raise the pressure to ambient; and removing the device from the chamber.

The present invention includes a first step of removing alkali metal contaminants by any suitable halogen-based plasma etch process, including the process described above. Thereafter the device is subjected to further processing to remove from the device any halogen contaminants. The further processing includes the steps of locating the device within a suitable process chamber, preferably the same chamber in which the halogen plasma etch was performed, and evacuating the chamber to a base, sub-atmospheric pressure. Preferably the base pressure is from about 10 to 200 milliTorr. Thereafter, the chamber is charged with an inert atmosphere, for example $N_2$, and the chamber pressure is raised to a level above the base pressure, preferably from about 0.5 to 10 Torr. The chamber pressure is maintained for a predetermined amount of time, preferably for about 10 seconds. Preferably, the chamber is cycle purged a number of times. That is, the chamber is evacuated and back-filled with an inert gas (e.g., nitrogen) a number of times in an attempt to purge the chamber of any reactive gases.

The chamber is then evacuated to a lower base pressure. Preferably lower than about 0.5 to 10 Torr, and more preferably to about 10 to 200 milliTorr. Thereafter, the chamber is charged with a gas selected from $N_2$, Ar, $O_2$, or a $H_2$ and $N_2$ gas mixture, a preferred $H_2$ and $N_2$ gas mixture comprises about 2 volume percent $H_2$, balance $N_2$. The chamber pressure is raised above the base pressure, with a chamber pressure of from about 0.5 to 10 Torr being preferred. Preferably the gas is continually flowed through the chamber and the exact gas flow rate will depend upon, among other things, the device size, chamber volume, etc. An excitation source is then turned on to form a plasma. Suitable excitation sources include, for example, microwave generators, RF generators, etc. The power level of the excitation level may vary according to various factors and when utilizing a microwave excitation source a preferred frequency level is about 2.45 Ghz. In a preferred embodiment, the plasma is formed at about room temperature, but other temperatures may be suitable. The excitation source is left on for a predetermined amount of time, preferably about 10 seconds, and then turned off.

After turning off the excitation source, the chamber is evacuated to a base pressure, preferably from about 10 to 200 milliTorr. Thereafter the chamber is charged with an inert gas, for example, nitrogen, to a pressure above the base pressure, preferably to about 0.5 to 10 Torr. Thereafter, the chamber may be brought to ambient pressure and the device removed.

The above steps may be repeated any number of times.

By following the steps of the invention, the alkali metal contaminants will be removed by the halogen-based plasma etch step and the labile halogen (e.g., fluorine) which results from the halogen plasma etch will be removed, via volumetric displacement, by the subsequent gas plasma treatment.

While the invention has been described with specificity, additional advantages and modifications will readily occur to those skilled in the art. Therefore, the invention in its broader aspects is not limited to the specific details shown and described herein. Accordingly, various modifications may be made without departing from the spirit or scope of the general inventive concept as defined by the appended claims and their equivalents.

What is claimed is:

1. A method for removing contaminants from a semiconductor integrated circuit device comprising:
    a. providing a semiconductor device having at least one metal-containing layer or dielectric layer;
    b. placing the device within a chamber and subjecting the device to a halogen-based plasma etch;
    c. evacuating the chamber to a sub-atmospheric pressure after the halogen plasma etch;
    d. charging the chamber with an inert gas to a pressure above the sub-atmospheric pressure;
    e. evacuating the chamber;
    f. charging the chamber with a gas selected from the group consisting of $N_2$, Ar, $O_2$, and a $H_2$ and $N_2$ gas mixture to a pressure above the sub-atmospheric pressure and a chamber temperature and turning on an excitation source to form a plasma;
    g. turning off the excitation source and evacuating the chamber to the sub-atmospheric pressure; and
    h. charging the chamber with an inert gas to a pressure above the sub-atmospheric pressure.

2. The method of claim 1, wherein in step c. the sub-atmospheric pressure is from about 10 to 200 milliTorr.

3. The method of claim 1, wherein the pressure in step d. is from about 0.5 to 10 Torr.

4. The method of claim 1, wherein the inert gas of step d. comprises nitrogen.

5. The method of claim 1, wherein in step e. the chamber is evacuated to about 10 to 200 milliTorr.

6. The method of claim 1, wherein the excitation source is a microwave excitation source.

7. The method of claim 6, wherein the microwave excitation source is provided for about 5 to 60 seconds at a frequency of about 2.45 Ghz.

8. The method of claim 1, wherein during step f. the chamber temperature is maintained at room temperature.

9. The method of claim 1, wherein during step f. the chamber pressure is from about 0.5 to 10 Torr.

10. The method of claim 1, wherein during step g. the sub-atmospheric pressure is from about 10 to 200 milliTorr.

11. The method of claim 1, wherein the plasma of step f. is provided for about 10 seconds.

12. The method of claim 1, wherein the halogen-based plasma etch of step b. is a fluorine plasma etch.

13. The method of claim 1, wherein the $H_2$ and $N_2$ gas mixture comprises about 2 volume percent $H_2$, balance $N_2$.

* * * * *